United States Patent [19]
Goser

[11] 3,968,479
[45] July 6, 1976

[54] COMPLEMENTARY STORAGE ELEMENT

[75] Inventor: Karl Goser, Munich, Germany

[73] Assignee: Siemens Aktiengesellschaft, Berlin and Munich, Germany

[22] Filed: Nov. 29, 1974

[21] Appl. No.: 528,094

[30] Foreign Application Priority Data
Dec. 6, 1973 Germany............................ 2360887

[52] U.S. Cl............................. 340/173 FF; 307/288; 307/291; 340/173 R; 307/238
[51] Int. Cl.²............................................ G11C 11/40
[58] Field of Search.................. 340/173 FF, 173 R; 307/238, 251, 279, 288, 291

[56] References Cited
UNITED STATES PATENTS

| | | | |
|---|---|---|---|
| 3,416,008 | 12/1968 | Memelink et al. | 340/173 FF |
| 3,644,907 | 2/1972 | Gricchi et al. | 340/173 FF |
| 3,757,313 | 9/1973 | Hines et al. | 340/173 FF |

*Primary Examiner*—Stuart N. Hecker
*Attorney, Agent, or Firm*—Hill, Gross, Simpson, Van Santen, Steadman, Chiara & Simpson

[57] ABSTRACT

A complementary storage element with two inverters and one selector element is disclosed wherein an inverter in each case consists of a switching element and a load element connected in series with a junction point therebetween and wherein the selector element is connected to a digit line, and wherein the gate terminal of the selector element is operated by a word line, the two inverters being connected in series with their source terminals being connected together at a junction point and the terminals of the load elements which are not connected to the switching transistors each connected to a supply voltage line. The switching transistors are provided with feedback.

6 Claims, 6 Drawing Figures

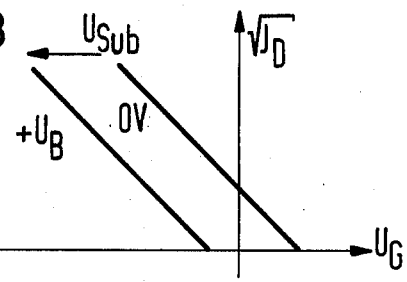
Fig.3
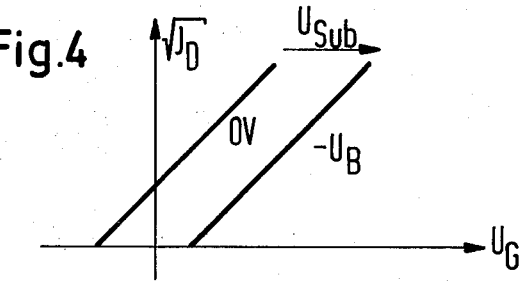
Fig.4
Fig.5
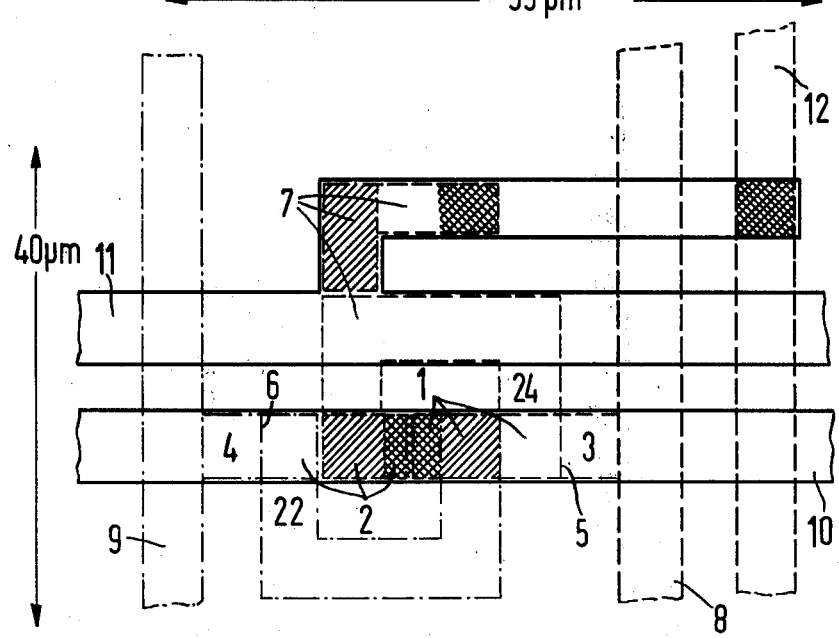

COMPLEMENTARY STORAGE ELEMENT

BRIEF SUMMARY OF THE INVENTION

The present invention relates to complementary storage element and particularly to static storage elements which have no regeneration circuits. It is a particular object of this invention to provide a static storage element employing MOS switching transistors which are of such a design that the storage element area amounts to only 2200 $\mu m^2$. A preferred arrangement of the present invention includes a pair of MOS field effect transistors of the depletion type which have their source terminals connected together at a junction point and which have their drain terminals connected to load resistors, respectively. The opposite ends of the load resistors are connected to voltage supply lines respectively. A selector field effect transistor has its drain connected to a digit line and its gate terminal connected to a word line. The source of the selector transistor is connected to the junction point between one of the switching transistors and its associated load resistor, and it is also connected to the substrate terminal of the other switching transistor. The substrate terminal of the first switching transistor is connected to the junction point between the second switching transistor and its associated load resistor to provide feedback. Similarly, the substrate terminal of the second transistor is connected to the junction point between the first switching transistor and its associated load resistor. The gate terminals of the two switching transistors are connected together and to a voltage reference line such as ground.

In a second form of the invention the switching transistors do not have substrate terminals. The gate terminal of one switching transistor is connected to the junction point between the second switching transistor and its associated load resistor, and the gate terminal of the second switching transistor is connected to the junction point between the first switching transistor and its associated load resistor.

It is an object of the present invention to provide a novel static storage element which is simple to manufacture, which is reliable in use, and which allows a savings of time in operation.

BRIEF DESCRIPTION OF THE DRAWINGS

FIGS. 3 and 4 show the characteristic curves of complementary MOS field effect transistors at various substrate bias voltages.

FIG. 5 schematically illustrates the design of a storage element in accordance with the invention as shown in FIG. 1.

DESCRIPTION OF THE PREFERRED EMBODIMENTS

Figure 1:
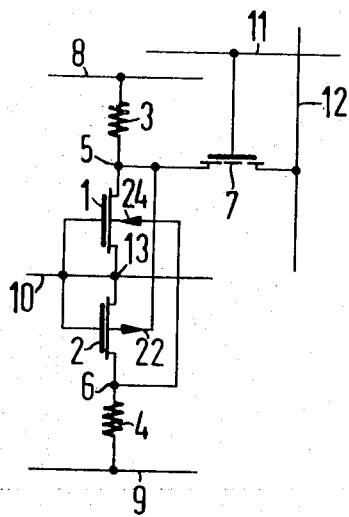
FIGS. 1 and 2 show circuit diagrams of storage elements in accordance with the invention.

Two inverter stages are connected in series in the manner illustrated in FIG. 1. Here one inverter stage consists of the load impedance 3 and a switching transistor 1, and the other inverter stage consists of the switching transistor 2 and the load impedance 4. The two switching transistors are complementary transistors. At the junction 5 one terminal of the load impedance 3 and the drain terminal of the switching transistor 1 of the first inverter stage are connected to one another. The other terminal of the load impedance 3 is connected to the line 8. The source terminal of the switching transistor 2 of the second inverter is likewise connected to the line 10. The drain terminal of this transistor 2 is, at the junction 6, connected to one terminal of the load impedance 4 of the second inverter. The other terminal of the load impedance 4 is connected to the line 9.

In the event that the switching transistor 1 is an n-channel transistor and the switching transistor 2 is a p-channel transistor, the line 8 carries a positive potential and the line 9 carries a negative potential. Preferably complementary metal oxide semiconductor transistors (hereinafter sometimes referred to as MOS transistors) are used.

The two gate terminals of the switching transistors 1 and 2 are connected to the line 10 which is preferably grounded.

A feedback occurs between the two inverter stages which is achieved by the fact that the substrate terminal 24 of the switching transistor 1 of the first inverter stage is connected to the junction 6 of the second inverter stage and the substrate terminal 22 of the switching transistor 2 of the second inverter stage is connected to the junction 5 of the first inverter stage. Advantageously, no contact holes are required for these connections.

The storage element is operated via a selector field effect transistor 7 which is connected to a junction point of one of the inverters.

In FIG. 1, the selector transistor 7 is on one side connected to the junction 5 of the inverter 1 and on the other side is connected to the digit line 12. The gate terminal of the transistor 7 may be operated via the word line 11.

In the following, the mode of functioning of the storage element will be described. It will be assumed that both transistors 1 and 2 are of the depletion type. In FIG. 3 the characteristic curve of a p-channel transistor 2 has been shown for various substrate bias voltages. FIG. 4 shows the curves of an n-channel transistor 1 for various substrate bias voltages. The storage element in accordance with the invention is in one stable state when both switching transistors 1 and 2 are conductive. In this state as a result of a voltage drop across the transistors, the ground potential of the line 10 is applied from the junction 13 via the conductive transistors 1 and 2 to the substrate terminals 22 and 24. As the substrate terminals are connected to a voltage which is very small in comparison to the operating voltage $U_B$ and as the gate voltage amounts to 0 V, both transistors remain conductive. In FIG. 3, this state is governed by the right-hand curve and in FIG. 4 it is governed by the left-hand curve.

In the other stable state, the two switching transistors 1 and 2 are blocked. In this case, virtually the supply voltage is connected via the load impedances 3 and 4 to the substrate terminals 22 and 24. As shown in the left-hand curve of FIG. 3 and the right-hand curve of FIG. 4, the transistors remain blocked in this case as the gate voltage amounts to a constant 0 V.

For the write-in of data in the first place the selector transistor 7 is switched conductive via the word line 11. Then the digit line 12 is connected with an item of data which sets the switching transistors 1 and 2 either in the conductive state or in the blocking state. The data for the conductive state consists, for example, of a pulse whose voltage amplitude is small in comparison to the operating voltage. For the conductive state the data consists of a pulse whose voltage amplitude is in the order of the operating voltage.

An advantage of this storage element is that the construction or design of the flip-flop of such a storage element contains only one contact hole which results in a substantial saving of space.

Figure 2:
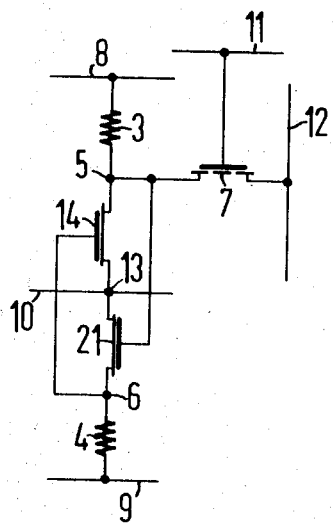

When the storage element of the invention is designed in accordance with FIG. 2, two switching transistors 14 and 27 are used which have no substrate terminals. Details of FIG. 2 which have already been described in association with FIG. 1 have been provided with corresponding references. The gate terminal of the transistor 14 of the first inverter stage is connected to the junction point 6 of the second inverter stage, and the gate terminal of the transistor 21 of the second inverter stage is connected to the junction 5 of the first inverter stage. However, two contact holes are required for the connection of the gate electrodes to the terminal zones of the switching transistors. The point 13 of this circuit does not absolutely need to be grounded.

When an n-channel transistor is used as transistor 14, and a p-channel transistor is used as transistor 21, a positive potential is carried by the line 8 and a negative potential is carried by the line 9.

In order to set the storage arrangement in the state in which both transistors are conductive, via the selector transistor a potential is applied to the gate terminal of a transistor so that the latter opens. For example, the potential $-U_B$ is applied to the transistor 21. This results in the transistor 14 likewise being switched conductive.

In order to set the storage arrangement in the state in which both transistors are blocked, the transistor 21 is blocked via the selector transistor 7. For example, the potential $+U_B$ is applied to the gate terminal of this transistor. This results in the gate of the transistor 14 being drawn towards $-U_B$ so that this transistor also blocks.

The rest power loss of the storage elements in accordance with the invention is, in the one stable point in which the two switching transistors are conductive, determined by the impedances of the load elements which can be designed to be of high ohmic value.

In a preferable form of the invention, the storage elements of the invention are designed in a way in which insular layers of silicon are applied to an insulating substrate of spinel or sapphire. The switching transistors are arranged in these insular layers, electrically insulated from one another. In this form, the substrate terminals of the transistors are insulated from each other and the complementary transistors can be relatively simply integrated next to one another.

FIG. 5 illustrates by example, a design of a storage element of the invention in accordance with FIG. 1. The design preferably employs an aluminum-gate and requires on an insulating substrate a storage element area of only 2200 $\mu m^2$. The conductor widths and conductor spacings are to 5 $\mu m$. This design of the storage element is relatively simple, since no contact hole is required for the cross-over coupling. A contact hole is required only for the conductive connection between the p-zone and the n-zone of the silicon layer (point 13) and two contact holes are required for the terminal of the selector transistor.

Figure 6:
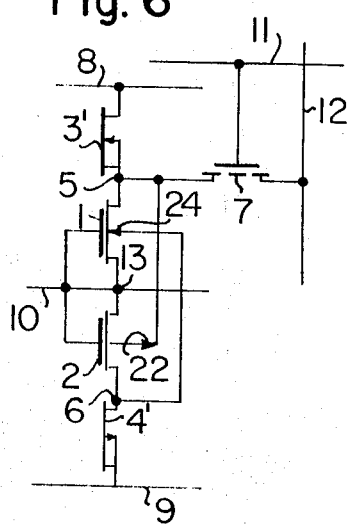
FIG. 6 shows a circuit diagram of storage elements in an arrangement similar to FIG. 1, but in which metal oxide semiconductor field effect transistors are employed specifically as impedance elements.

The design shown in FIG. 5 can also be used without major alterations for a storage element in which the load elements are realized not by resistors but by field effect transistors of the depletion type. This arrangement is diagrammatically illustrated in the circuit diagram of FIG. 6 which corresponds to FIG. 1, with the exception that metal oxide semiconductor field effect transistors 3' and 4' are employed as the specific impedance elements broadly referred to as 3 and 4 in FIG. 1. The transistors 3' and 4' are of the enhancement type and are n-channel and p-channel types, respectively. The channel zones of these transistors serve as impedance zones. The gate electrodes are connected and contacted to the relevant supply voltage lines.

The zones represented in FIG. 5 by broken lines are, for example, n-doped zones of a silicon layer. This silicon layer is preferably applied to a substrate of spinel or sapphire. The zones outlined by dash-dotted lines are, for example, p-doped zones of the silicon layer. The continuous lines represent the aluminum conductor paths. Single-shaded areas represent the gate electrodes of the switching transistors. Beneath the double-shaded zones, the aluminum conductor paths are directly electrically connected to the p-doped and n-doped zones of the silicon layer.

A storage element in accordance with the invention can also be designed having a silicon-gate on an insulating substrate composed of spinel or sapphire.

It will be apparent to those skilled in the art that many modifications and variations may be effected without departing from the spirit and scope of the novel concepts of the present invention.

I claim as my invention:

1. A complementary storage element comprising first and second FET switching inverters and a FET selector element, said FET inverters being complementary to each other, first and second load elements, a pair of voltage supply lines, said FET inverters and said elements being serially connected with one end of said first load element connected to one of said voltage supply lines and with its other end connected to the drain terminal of said first FET inverter, with the source terminals of said FET inverters connected together, and with one end of said second load element connected to the other of said voltage supply lines and the other end connected to the drain terminal of said second FET inverter, there being a first junction point between said first load element and said first FET inverter and a second junction point between said second load element and said second FET inverter, a digit line, a word line, said FET selector element being connected to one of said junction points and to said digit line, the gate terminal of said FET selector being connected to said word line, the gate terminal of said second FET inverter being connected to said first junction point and the gate terminal of said first FET inverter being connected to said second junction point.

2. A complementary storage element as set forth in claim 1, in which the switching transistors are metal oxide semiconductor field effect transistors of the depletion type.

3. A complementary storage element as set forth in claim 1, in which the load elements are resistors.

4. A complementary storage element as set forth in claim 1, in which the load elements are metal oxide semiconductor field effect transistors, wherein the channel zones of these transistors serve as impedance zones and wherein the gate electrodes of these transistors are connected to the relevant supply voltage lines.

5. A complementary storage element as set forth in claim 1, in which the switching transistors are FETs whose gate terminals and the connection point between the two inverter stages are connected to ground, and in which the substrate terminal of the switching transistor of the first inverter is connected to the junction point of the second inverter and the substrate terminal of the switching transistor of the second inverter is connected to the junction point of the first inverter.

6. In a storage element of the type set forth in claim 5, the method of operation in which to set the storage element in the one state in which both transistors are conductive, a pulse is applied via the selector transistor to a junction point of the storage element which pulse acts via the substrate terminal connected to said junction point to switch the transistor belonging to this substrate terminal conductive, wherein the gate terminal of this transistor carries a fixed given potential, and that in order to set the storage element in the other state in which both transistors are blocked, a pulse is applied via the selector transistor to a junction point of the storage element which acts via the substrate terminal connected to this junction point to block the transistor belonging to this substrate terminal, wherein the gate terminal carries the given potential.

* * * * *